United States Patent
Nojima

(10) Patent No.: US 11,070,140 B2
(45) Date of Patent: Jul. 20, 2021

(54) LOW INDUCTANCE BUS ASSEMBLY AND POWER CONVERTER APPARATUS INCLUDING THE SAME

(71) Applicant: Eaton Intelligent Power Limited, Dublin (IE)

(72) Inventor: Geraldo Nojima, Fort Mill, SC (US)

(73) Assignee: Eaton Intelligent Power Limited

( * ) Notice: Subject to any disclaimer, the term of this patent is extended or adjusted under 35 U.S.C. 154(b) by 6 days.

(21) Appl. No.: 16/170,880

(22) Filed: Oct. 25, 2018

(65) Prior Publication Data

US 2020/0136522 A1 Apr. 30, 2020

(51) Int. Cl.
| | |
|---|---|
| *H02M 7/00* | (2006.01) |
| *H02M 7/797* | (2006.01) |
| *H05K 5/00* | (2006.01) |
| *H05K 5/02* | (2006.01) |
| *H05K 5/04* | (2006.01) |
| *H05K 7/04* | (2006.01) |

(52) U.S. Cl.
CPC ........... *H02M 7/003* (2013.01); *H02M 7/797* (2013.01); *H05K 5/0021* (2013.01); *H05K 5/0247* (2013.01); *H05K 5/04* (2013.01); *H05K 7/04* (2013.01)

(58) Field of Classification Search
CPC .... H02M 7/003; H02M 7/797; H05K 5/0021; H05K 5/0247; H05K 5/04; H05K 7/04
See application file for complete search history.

(56) References Cited

U.S. PATENT DOCUMENTS

| | | | | |
|---|---|---|---|---|
| 8,587,977 | B2* | 11/2013 | Nishikimi | H02M 7/003 363/141 |
| 9,042,112 | B2* | 5/2015 | Guan | H05K 7/18 361/763 |
| 10,522,957 | B2* | 12/2019 | Tanabe | H01L 25/117 |
| 10,524,398 | B2* | 12/2019 | Tokuyama | H01L 23/36 |
| 2004/0012983 | A1* | 1/2004 | Fearing | F28D 15/0266 363/16 |
| 2007/0076355 | A1* | 4/2007 | Oohama | H01L 24/36 361/676 |
| 2007/0109715 | A1* | 5/2007 | Azuma | B60K 6/28 361/299.3 |
| 2008/0049476 | A1* | 2/2008 | Azuma | B60L 50/60 363/131 |
| 2011/0051371 | A1* | 3/2011 | Azuma | H02M 7/003 361/699 |
| 2011/0249421 | A1* | 10/2011 | Matsuo | B60K 6/445 361/821 |

(Continued)

*Primary Examiner* — Rockshana D Chowdhury
*Assistant Examiner* — Douglas R Burtner
(74) *Attorney, Agent, or Firm* — Stanek Lemon Crouse & Meeks, P.A.

(57) ABSTRACT

An apparatus, such as a power converter, includes first, second and third core bus plates arranged in parallel. The apparatus also includes a first bus extension plate joined to the first core bus plate and extending therefrom at a first angle and a second bus extension plate joined to the second core bus plate and extending therefrom at a second angle. The apparatus further includes a third bus extension plated joined with the third core bus plate and disposed parallel to the first bus extension plate and a fourth bus extension plate joined with the third core bus plate and disposed parallel to the second bus extension plate.

11 Claims, 15 Drawing Sheets

(56) References Cited

U.S. PATENT DOCUMENTS

| | | | | |
|---|---|---|---|---|
| 2014/0111959 A1* | 4/2014 | Li | ............... | H02M 7/487 |
| | | | | 361/809 |
| 2014/0160823 A1* | 6/2014 | Uetake | ............... | H02M 7/003 |
| | | | | 363/141 |
| 2015/0016063 A1* | 1/2015 | Higuma | ............... | H05K 7/209 |
| | | | | 361/714 |
| 2016/0241136 A1* | 8/2016 | Nakashima | ............... | H02M 1/44 |
| 2016/0365788 A1* | 12/2016 | Singh | ............... | H01R 24/48 |
| 2019/0008002 A1* | 1/2019 | Kanai | ............... | H05B 6/06 |
| 2019/0067167 A1* | 2/2019 | Hong | ............... | H01L 25/16 |
| 2019/0098777 A1* | 3/2019 | Nakatsu | ............... | H05K 7/20927 |
| 2019/0320549 A1* | 10/2019 | Song | ............... | H05K 5/0021 |
| 2019/0356116 A1* | 11/2019 | Ratadiya | ............... | H02M 7/48 |
| 2020/0204083 A1* | 6/2020 | Hotta | ............... | H01L 23/49562 |
| 2020/0281087 A1* | 9/2020 | Schmid | ............... | H01L 23/50 |

* cited by examiner

LOW INDUCTANCE BUS ASSEMBLY AND POWER CONVERTER APPARATUS INCLUDING THE SAME

STATEMENT OF GOVERNMENT SUPPORT

This invention was made with Government support under Contract #DE-EE0007253 awarded by the U.S. Department of Energy. The Government has certain rights in this invention.

BACKGROUND

The inventive subject matter relates to power conversion apparatus and, more particularly, to power converter bus structures and power converter systems incorporating the same.

Conventional power converter apparatus commonly use silicon-based semiconductor switching devices, such as insulated gate bipolar transistors (IGBTs). Such devices are typically limited to operating voltages less than 10 kV and switching frequencies less than 100 kHz. For applications requiring higher operating voltages and frequencies, wide bandgap semiconductor switching devices, such as silicon carbide (SiC) MOSFETs, have been developed to replace conventional silicon IGBT-based solutions.

Wide bandgap semiconductor switching devices may be operated at frequencies on the order of 20 times greater than the maximum operating frequencies of conventional silicon IGBTs. At these higher switching speeds, circuit parasitics, such as parasitic inductance and capacitance associated with interconnecting bus bars, can cause significant voltage and current transients that can be detrimental to operation of a power converter and limit full utilization of the capabilities of these higher performance devices.

SUMMARY OF THE INVENTION

Some embodiments of the inventive subject matter provide an apparatus including first, second and third core bus plates arranged in parallel. The apparatus also includes a first bus extension plate joined to the first core bus plate and extending therefrom at a first angle and a second bus extension plate joined to the second core bus plate and extending therefrom at a second angle. The apparatus further includes a third bus extension plated joined with the third core bus plate and disposed parallel to the first bus extension plate and a fourth bus extension plate joined with the third core bus plate and disposed parallel to the second bus extension plate.

In some embodiments, the third core bus plate may be disposed between the first and second core bus plates. The first bus extension plate may extend from the first core bus plate in a first direction perpendicular to a plane of the first core bus plate and the second bus extension plate may extend from the second core bus plate in a second direction opposite the first bus direction. The third bus extension plate may extend from the third core bus plate in the first direction and the fourth bus extension plate may extend from the third core bus plate in the second direction.

In further embodiments, the first bus extension plate may include a first planar member that joins the first core bus plate at a first arcuate joint. The second bus extension plate may include a second planar member that joins the second core bus plate at a second arcuate joint. The third and fourth bus extension plates may include third and fourth planar members that join the third core bus plate at a rounded Y joint.

According to some embodiments, the first bus extension plate may join the first core bus plate at a first edge thereof and the second bus extension plate may join the second core bus plate at a first edge thereof. The apparatus may further include a fifth bus extension plate joining the first core bus plate at a second edge thereof and extending therefrom at a third angle, a sixth bus extension plate joining the second core bus plate at a second edge thereof and extending therefrom at a fourth angle, a fourth core bus plate disposed in parallel with the first, second and third core bus plates, a seventh bus extension plate joined to the fourth core bus plate and disposed parallel to the fifth bus extension plate, and an eighth bus extension plate joined to the fourth core bus plate and disposed parallel to the sixth bus extension plate. The first and fifth bus extension plates may extend from the first core bus plate in a first direction perpendicular to a plane of the first core bus plate and the second and sixth bus extension plates may extend from the second core bus plate in a second direction opposite the first direction. The third and fourth core bus plates may be disposed between the first and second core bus plates.

The apparatus may further include a ninth bus extension plate joining the first core bus plate at a third edge thereof and extending therefrom at a fifth angle, a tenth bus extension plate joining the second core bus plate at a third edge thereof and extending therefrom at a sixth angle, a fifth core bus plate arranged in parallel with the first, second, third and fourth core bus plates, an eleventh bus extension plate joined to the fifth core bus plate and disposed parallel to the ninth bus extension plate, and a twelfth bus extension plate joined to the fifth core bus plate and disposed parallel to the tenth bus extension plate. The first, fifth and ninth bus extension plates may extend from the first core bus plate in the first direction and the second, sixth and tenth bus extension plates may extend perpendicularly from the second core bus plate in the second direction. The third, fourth and fifth core bus plates may be disposed between the first and second core bus plates.

According to some aspects, the apparatus may further include a first semiconductor switching device electrically connected to ends of the first and third bus extension plates and a second semiconductor switching device electrically connected to ends of the second and fourth bus extension plates. The apparatus may include a power converter circuit including the first and second semiconductor devices, wherein the first core bus plate and the first bus extension plate are components of a first DC bus of the power converter circuit, wherein the second core bus plate the second bus extension plate are components of a second DC bus of the power converter circuit, and wherein the third core bus plate, the third bus extension plate and the fourth bus extension plate are components of an input bus and/or an output bus of the power converter circuit.

A first capacitor may be electrically connected to the first bus core plate and a second capacitor may be electrically connected to the second bus core plate. The apparatus may further include a fifth bus extension plate joined to the first bus core plate, extending at an angle therefrom and electrically connected to a first terminal of the first capacitor, a sixth bus extension plate joined to the second bus core plate, extending at an angle therefrom and electrically connected to a first terminal of the second capacitor, and a common plate parallel to the fifth and sixth bus extension plates and electrically connected to second terminals of the first and second capacitors, wherein the third bus core plate has a portion extending between the fifth and sixth bus extension plates and through an opening in the common plate.

Further embodiments of the inventive subject matter provide an apparatus including first, second and third buses arranged in parallel, the third bus disposed between the first and second buses, a first bus extension extending from the first bus in first direction perpendicular to the first bus, a second bus extension extending from the second bus in a second direction perpendicular to the second bus and opposite the first direction, a third bus extension extending from the third bus in parallel with the first bus extension, and a fourth bus extension extending from the third bus in parallel with the second bus extension. A first semiconductor switching device is coupled to an end of the first bus extension and to an end of the third bus extension and a second semiconductor switching device is coupled to an end of the second bus extension and to an end of the fourth bus extension.

The first, second and third buses may include respective first, second and third planar members. The first bus extension may be joined to the first bus at a first edge of the first planar member, the second bus extension may be joined to the second bus at a first edge of the second planar member, and the third and fourth bus extensions may be joined to the third bus at a first edge of the third planar member. The apparatus may further include a fourth bus including a fourth planar member arranged in parallel with the first, second and third buses, a fifth bus extension joined to the first bus at a second edge of the first planar member extending from the first bus in the first direction, a sixth bus extension joined to the second bus at a second edge of the second planar member and extending from the second bus in the a second direction, a seventh bus extension joined to the fourth bus at a first edge of the fourth planar member and extending in parallel with the fifth bus extension, and an eighth bus extension joined to the fourth bus at the first edge of the fourth planar member and extending in parallel with the sixth bus extension. A third semiconductor switching device may be coupled to an end of the fifth bus extension and to an end of the seventh bus extension, and a fourth semiconductor switching device may be coupled to an end of the sixth bus extension and to an end of the eighth bus extension.

Still further embodiments provide an apparatus including first and second semiconductor switching devices disposed opposite one another at respective ones of opposing first and second surfaces, a first bus including a first conductive plate disposed between the first and second surfaces and extending in a first direction towards the first surface to electrically connect to the first semiconductor switching device, a second bus including a second conductive plate disposed between the first and second surfaces and extending in a second direction perpendicular to the first direction towards the second surface to electrically connect to the second semiconductor switching device, and a third bus including a third conductive plate disposed parallel to the first conductive plate and electrically connected to the first semiconductor switching device and a fourth conductive plate disposed parallel to the second conductive plate and electrically connected to the second semiconductor switching device and the third conductive plate.

DETAILED DESCRIPTION

Figure 1:
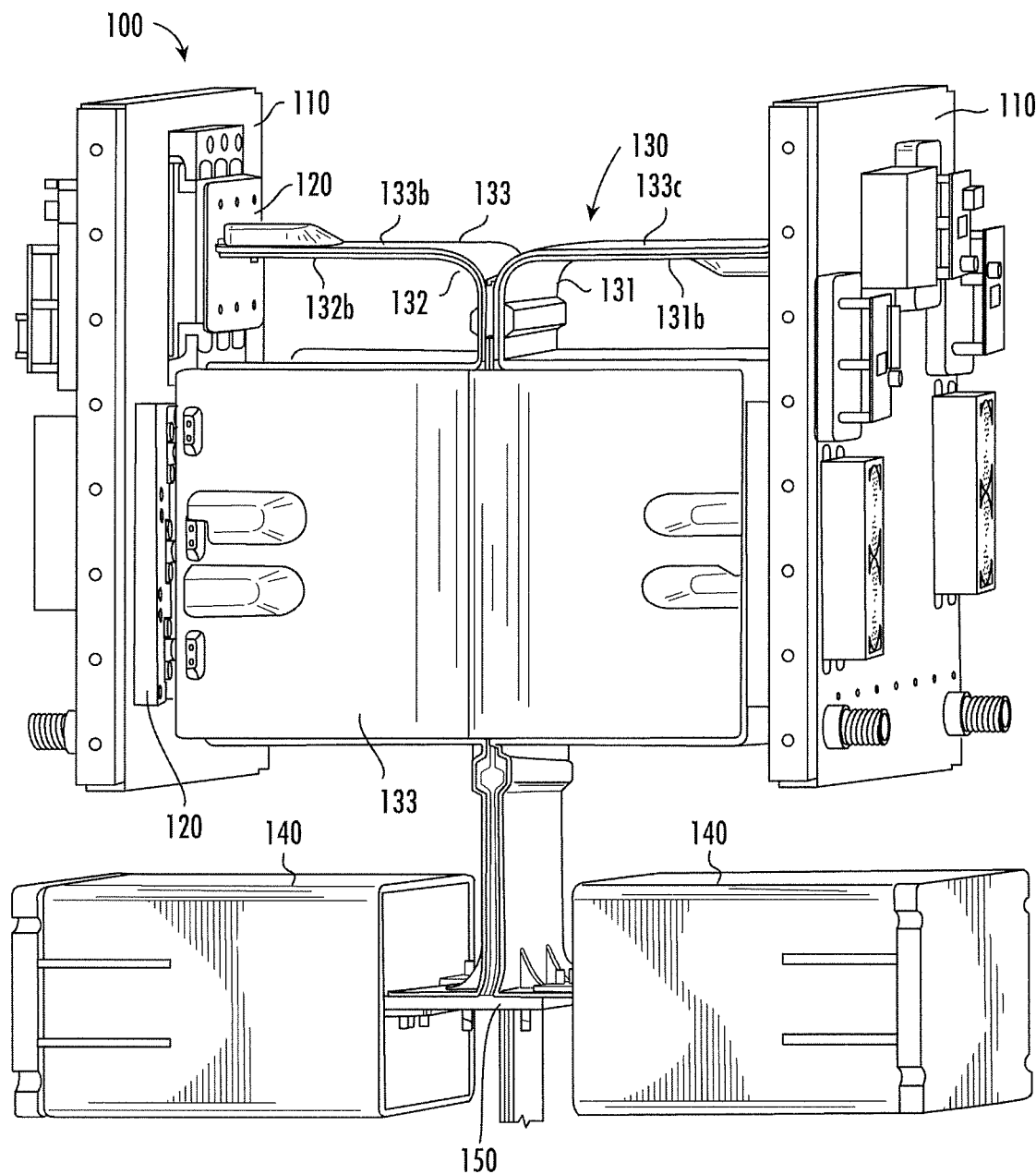
FIGS. 1 and 2 are perspective views illustrating a power converter apparatus according to some embodiments.

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like items. It will be understood that when an item is referred to as being "connected" or "coupled" to another item, it can be directly connected or coupled to the other item or intervening items may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, items, and/or components, but do not preclude the presence or addition of one or more other features, integers, steps, operations, items, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

Figure 2:
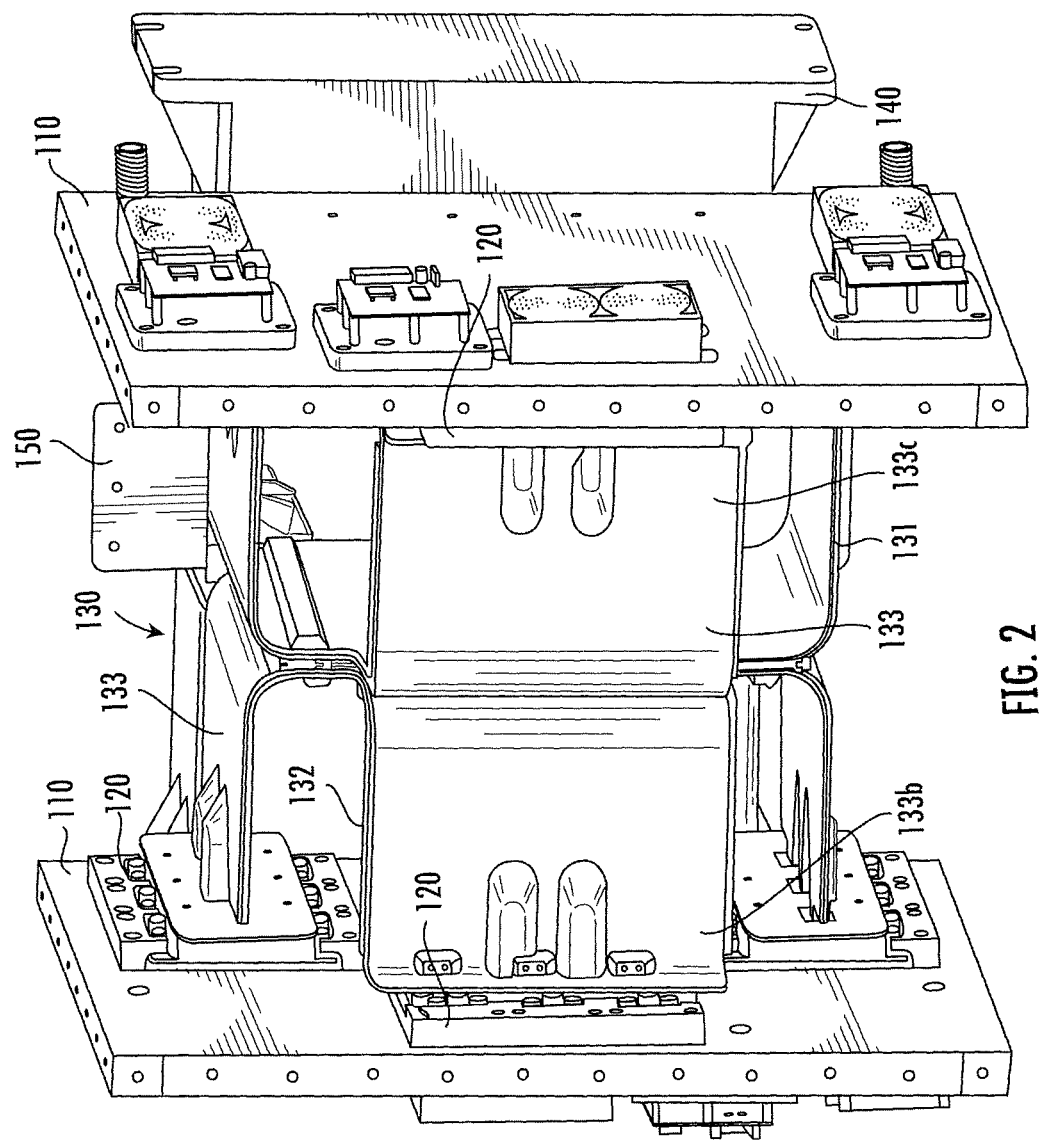
Figure 17:
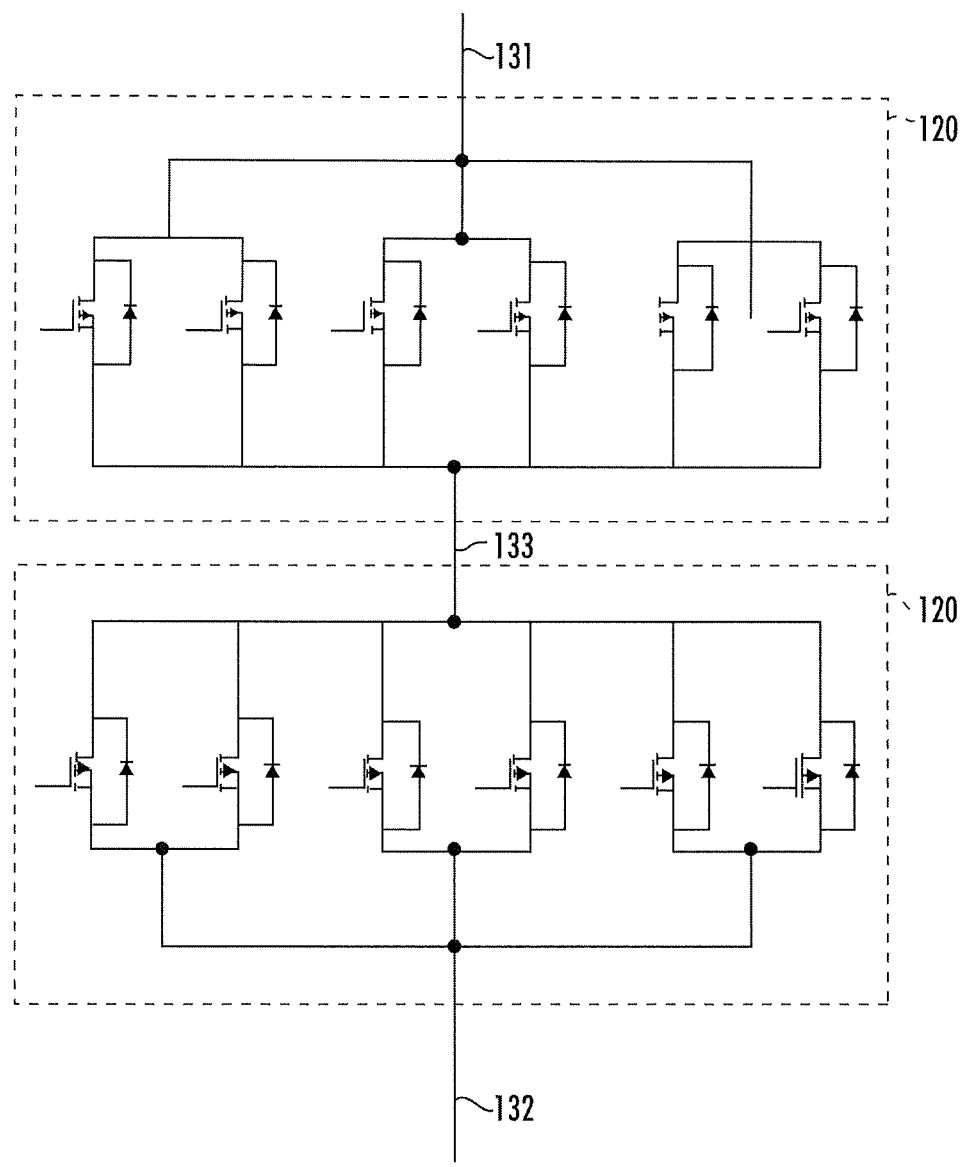
FIG. 17 is a schematic diagram illustrating a half-bridge circuit in the power converter apparatus of FIGS. 1 and 2.

FIGS. 1 and 2 illustrate a power converter apparatus 100 according to some embodiments of the inventive subject matter. The apparatus 100 includes semiconductor switching devices, here shown as power transistor modules 120, which are mounted on opposing parallel heat sinks 110. Each of the modules 120 includes one or more power transistors. For example, each of the modules may include six power MOSFET transistors, which may be connected in parallel to increase current capability. A bus assembly 130 interconnects the modules 120 and includes first and second DC buses 131, 132 and three input/output buses 133 (one per phase), which interconnect the transistor modules 120 to implement a three-phase converter including three half-bridge circuits, such as the half-bridge circuit 1700 shown schematically in FIG. 17. It will be appreciated that such a converter may be operated as an inverter, a rectifier or a bidirectional converter.

As further illustrated in FIGS. 1 and 2, the converter apparatus 100 also includes storage capacitors 140, which have first terminals coupled to respective ones of the DC busses 131, 132 and second terminals coupled in common to a common bus 150. As explained in greater detail below, the DC buses 131, 132 and the input/output buses 133 are configured to provide low-inductance interconnections of the capacitors 140 and the transistor modules 120, which can be particularly advantageous for applications in which the transistor modules 120 include wide bandgap switching devices, such as Group III-V wide bandgap MOSFETs, that can be operated at high switching speeds and operating voltages.

Figure 3:
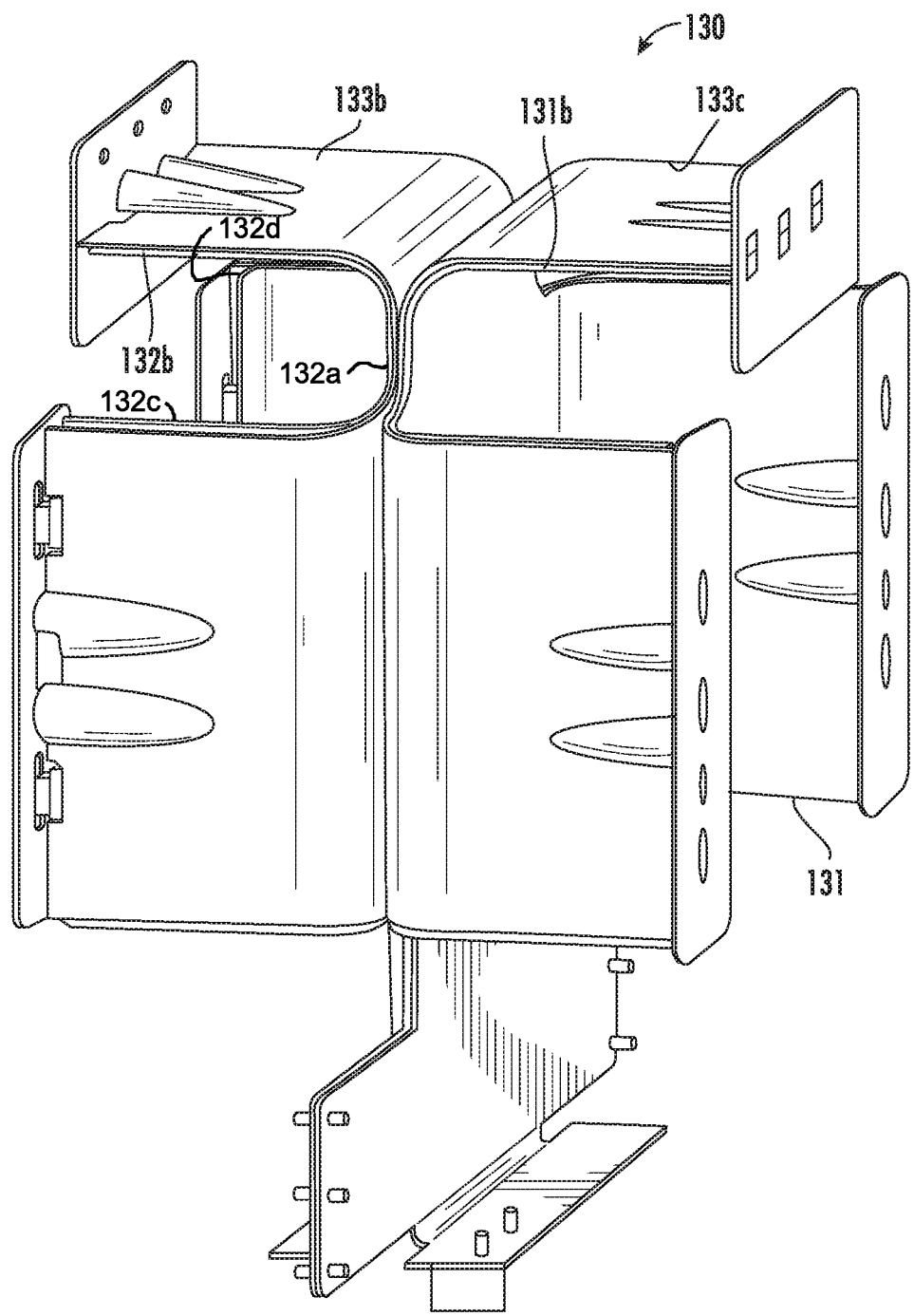
FIG. 3 is a perspective view of a bus assembly of the power converter apparatus of FIG. 1.
Figure 4:
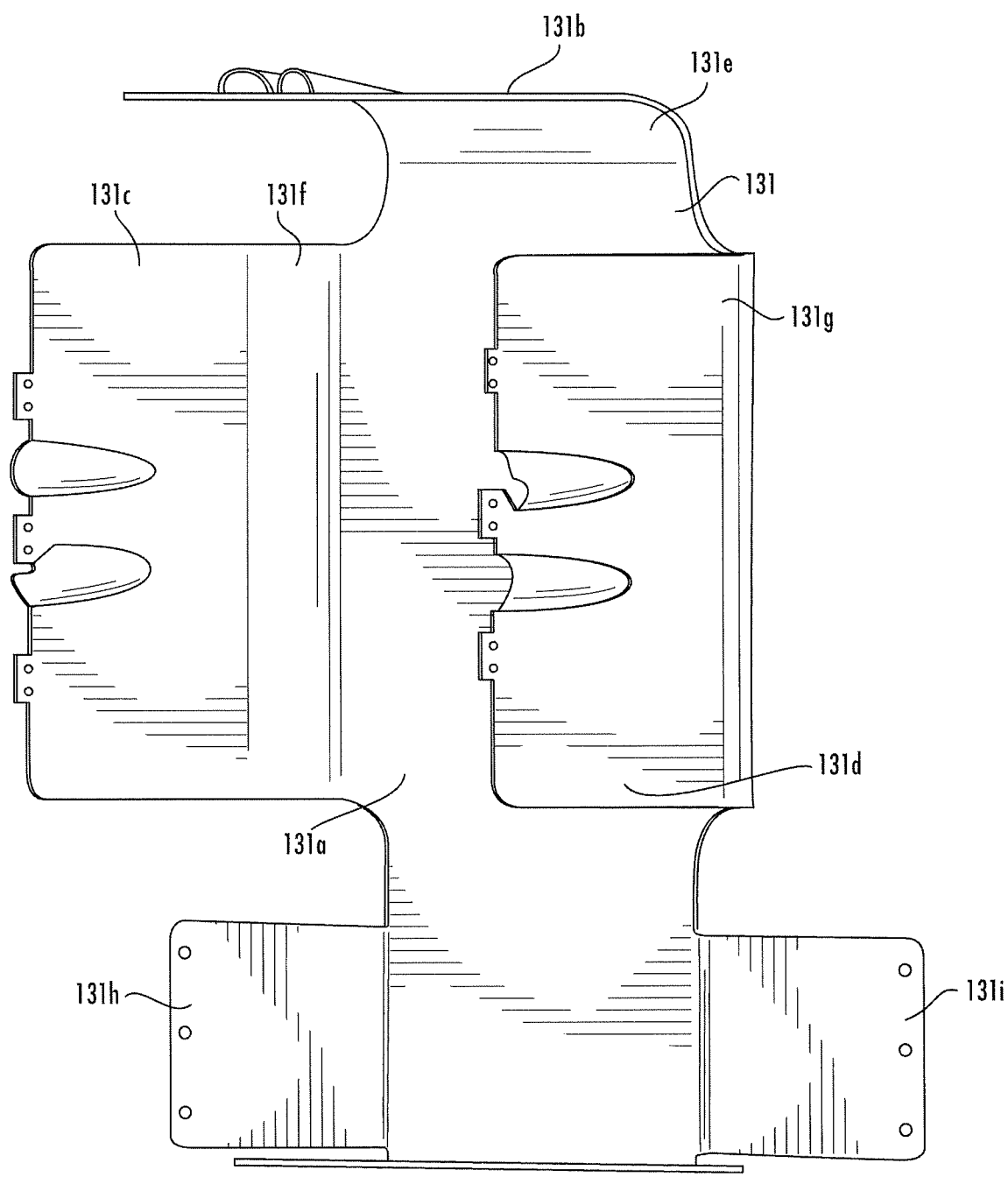
FIG. 4 is an isolated perspective view of a DC bus of the bus assembly of FIG. 3.

FIGS. 3-7 illustrate details of the bus assembly 130. Referring to FIGS. 3 and 4, the first DC bus 131 includes a core plate 131a from which first, second and third bus extension plates 131b, 131c, 131d extend in a perpendicular fashion to connect to the transistor modules 120. The first, second and third bus extension plates 131b, 131c, 131d are joined to the core plate 131a by rounded, arcuate joints 131e, 131f, 131g, which can provide a more uniform current distribution and reduce the likelihood of arcing that can arise from the presences of sharp edges or similar features. Additional fourth and fifth bus extension plates 131h, 131i extend laterally from the core plate 131a to provide connections to a DC source and/or load. It will be appreciated that the second DC bus 132 has a similar structure including a core plate 132a and bus extension plates 132c, 132d.

Figure 5:
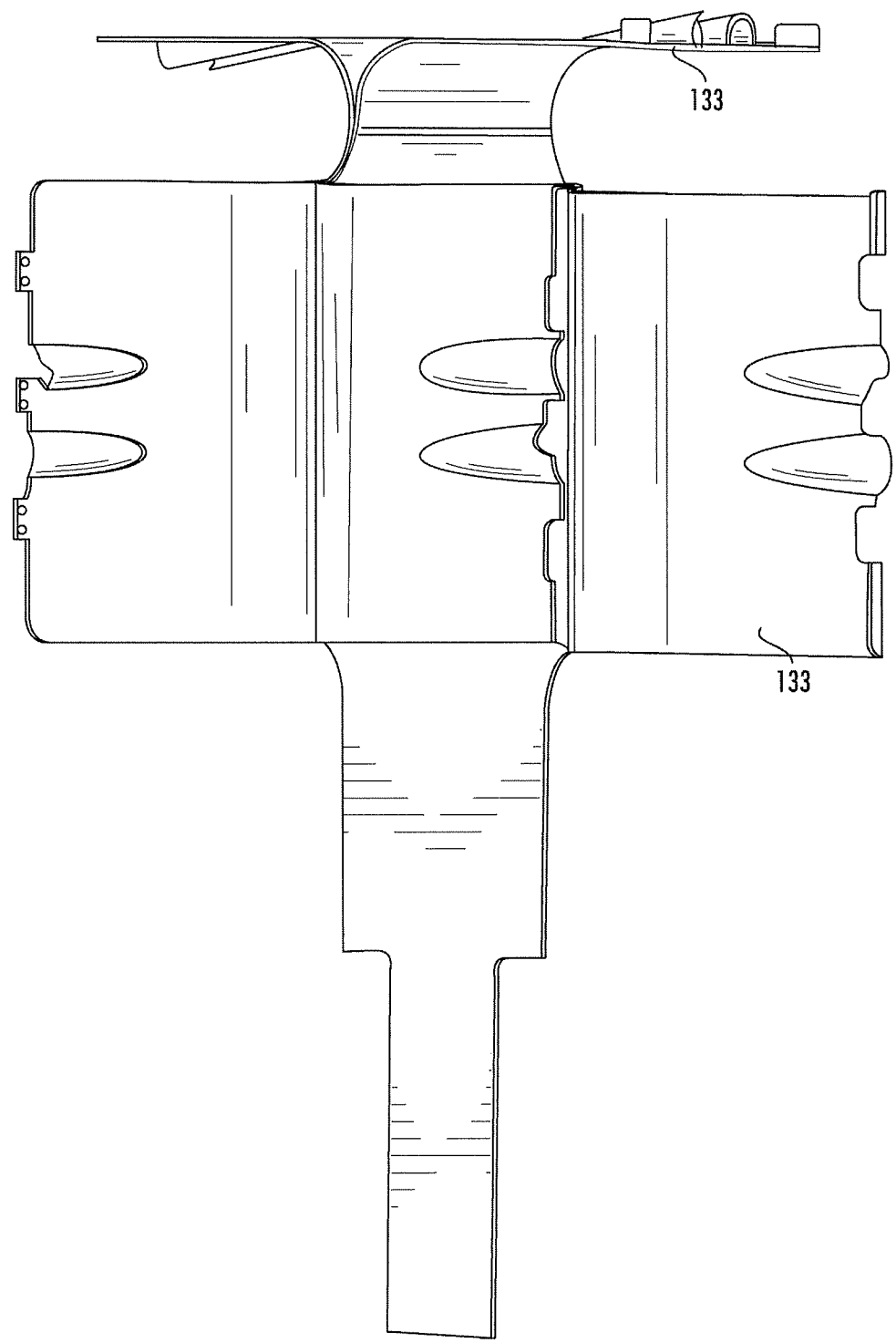
FIG. 5 is an isolated perspective view of input/output buses of the bus assembly of FIG. 3.
Figure 6:
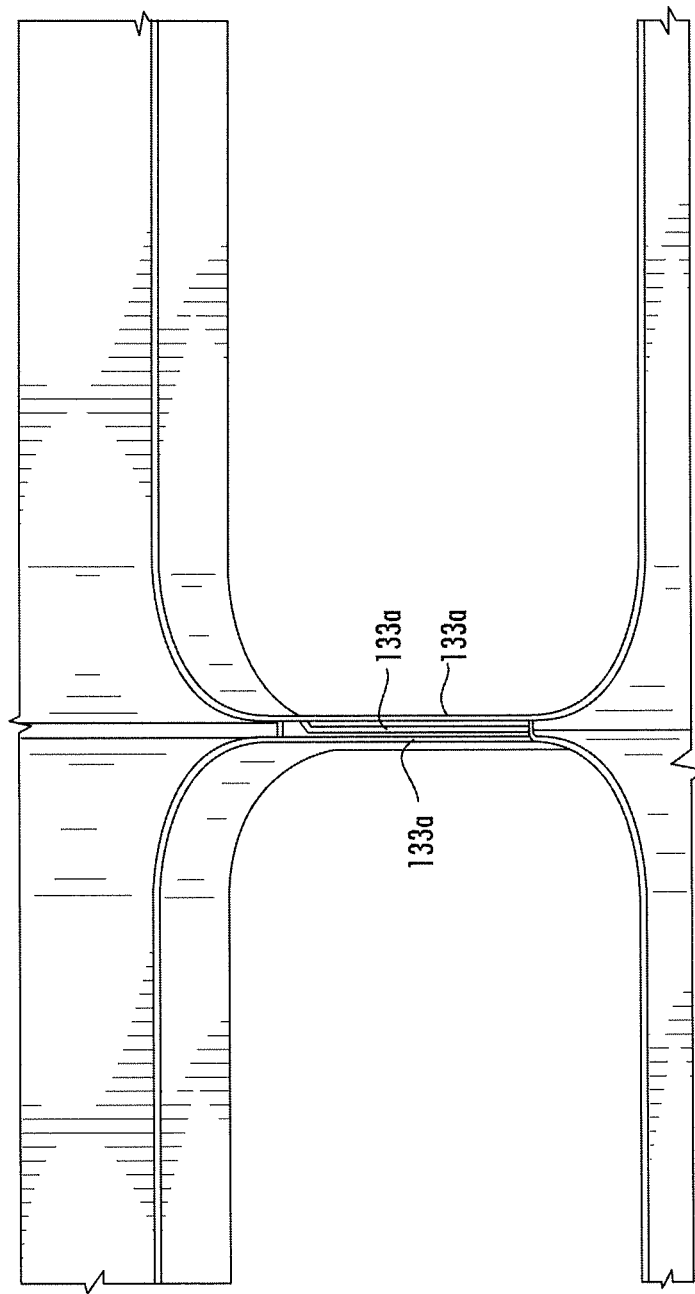
FIG. 6 is a detailed perspective view of core plates of the input/output buses of FIG. 4.
Figure 7:
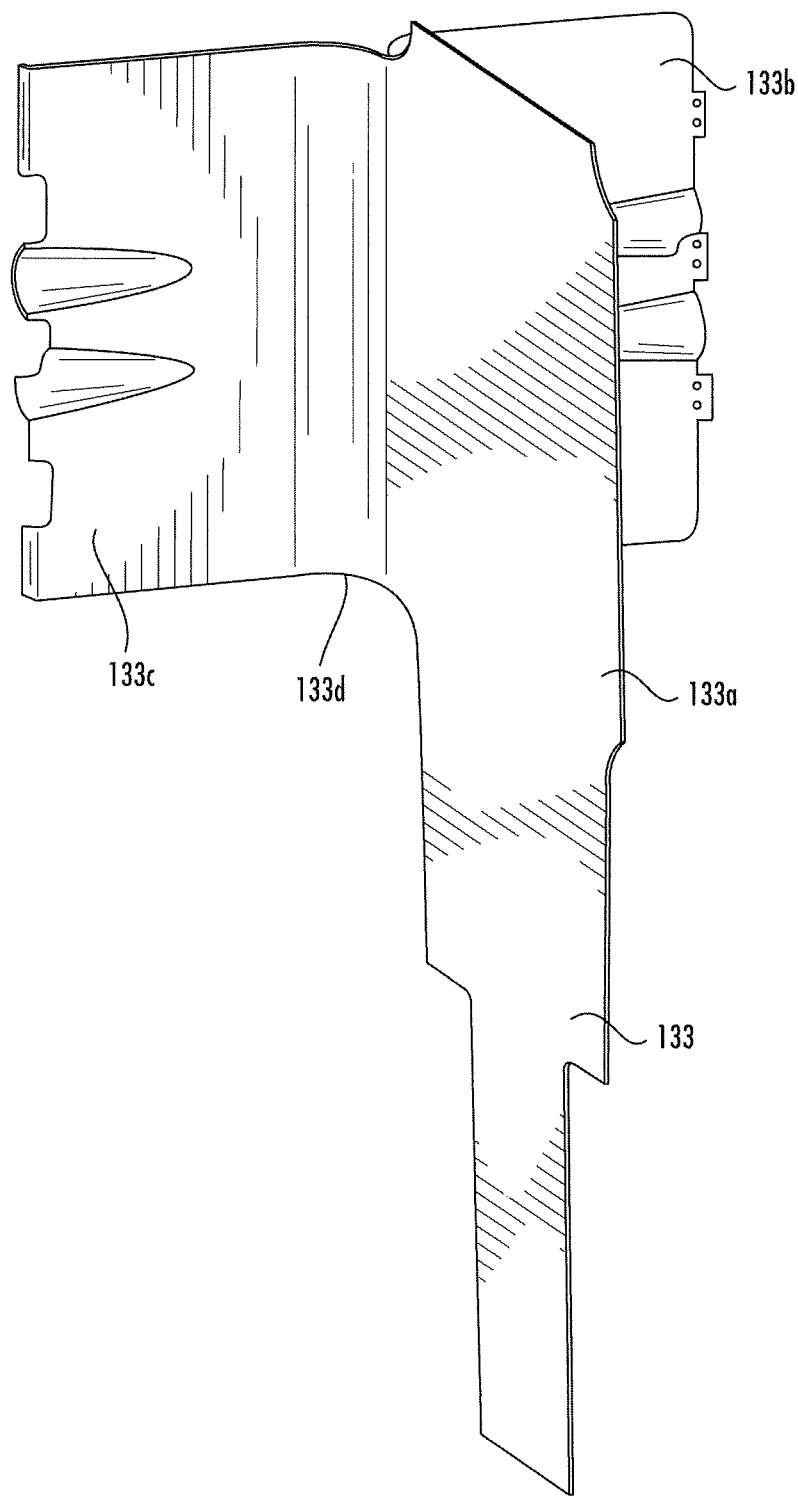
FIG. 7 is an isolated perspective view of one of the input/output buses of FIG. 3.

FIGS. 5-7 illustrate the structure of the input/output buses 133. Each of the input/output buses 133 includes a core plate 133a, from which first and second bus extension plates 133b, 133c extend perpendicularly from the core plate 133a in opposite first and second directions. The first and second bus extension plates 133b, 133c are joined to the core plate 133a at a rounded Y-cross section joint that provides arcuate junctions between the bus extension plates 133b, 133c and the core plate 133a. As explained above, this configuration can improve current distribution and reduce the likelihood of arcing. Referring to FIG. 6, the core plates 133a of the input/output buses 133 are arranged in parallel and separated by insulating material (not shown), resulting in composite input/output bus structure as shown in FIG. 5.

Referring again to FIG. 3, respective ones of the input/output bus extension plates 133b, 133c are disposed parallel to and generally conform to the contours of respective ones of the DC bus extension plates 131b, 132b of the first and second DC buses 131, 132. As shown in FIGS. 1 and 2, ends of the parallel DC and input/output bus extension plates 131b, 133c are electrically connected a first one of the transistor modules 120, while ends of the parallel bus extension plates 132b, 133b are electrically connected to a second one of the transistor modules 120. The use of relatively wide, plate-type bus conductors and close, conformal parallel routing of the ingoing and outgoing buses connected to each transistor module 120 can reduce stray inductance in comparison to conventional designs. The symmetrical configuration of the bus structure 130 with respect to the capacitors 140 can also provide substantially equal current sharing among the transistors in the modules 120.

The DC buses 131, 132 and the input/output buses 133 can be provided with additional features to, for example, achieve desirable current distribution characteristics and/or limit arcing at high operating voltages. For example, as shown in FIG. 1, lateral edges of the parallel DC bus extension plates 131b, 132b and the corresponding parallel input/output bus extension plates 133b, 133c can be slightly offset to reduce the likelihood of arcing between these edges. The DC buses 131, 132 and the input/output buses 133 can be fabricated using any of a number of different techniques to achieve desired topological and other features. For example, in some embodiments, the DC buses 131, 132 and the input/output buses 133 could be fabricated using three-dimensional (3D) printing techniques, such as direct metal laser sintering (DMLS), which can be used to introduce features such as variable thickness regions, variable resistance regions, openings, meshes and the like. Such features may be used, for example, to achieve a desired current distribution and/or limit the likelihood of arcing between the buses and adjacent structures.

Figure 8:
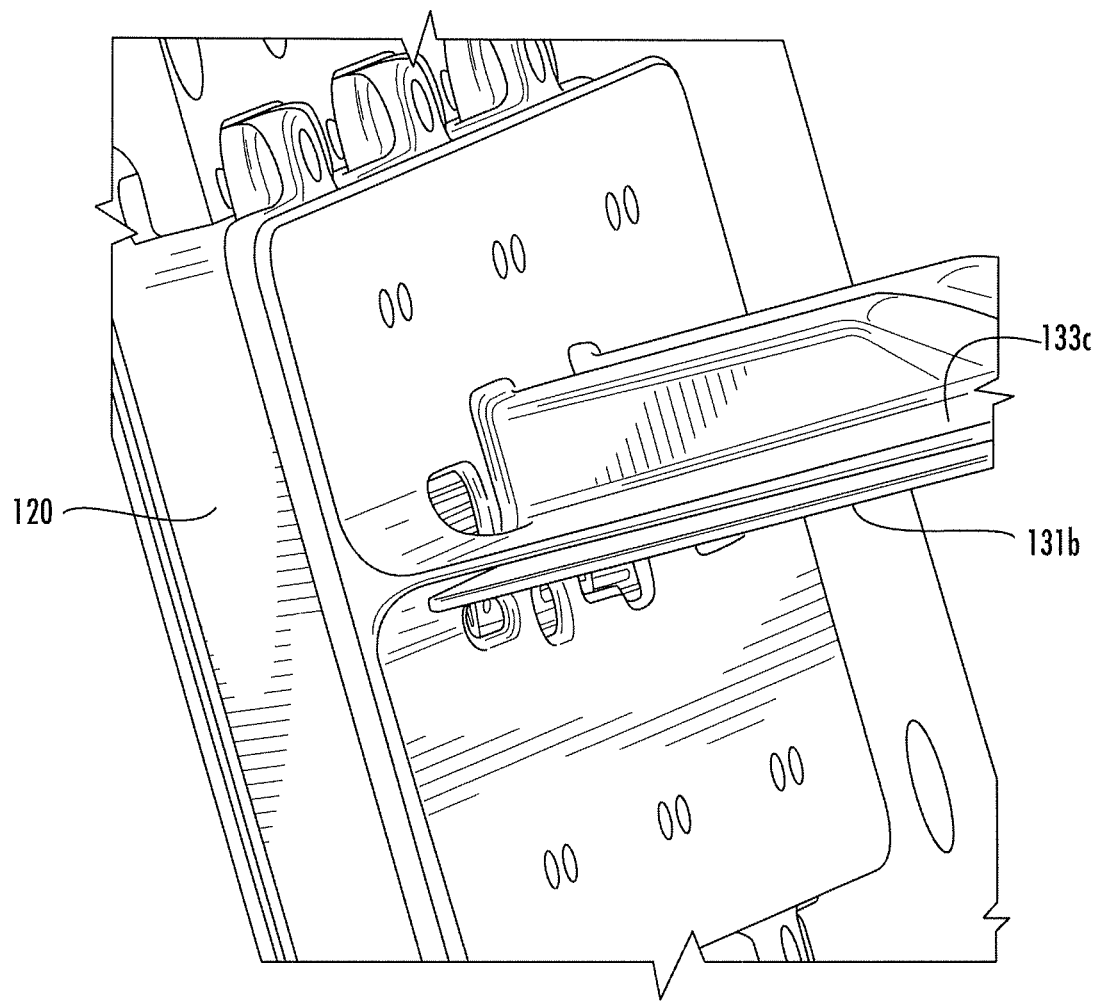
FIGS. 8 and 9 are detailed perspective views of connections of the bus assembly and a power transistor module in the power converter apparatus of FIGS. 1 and 2.
Figure 9:
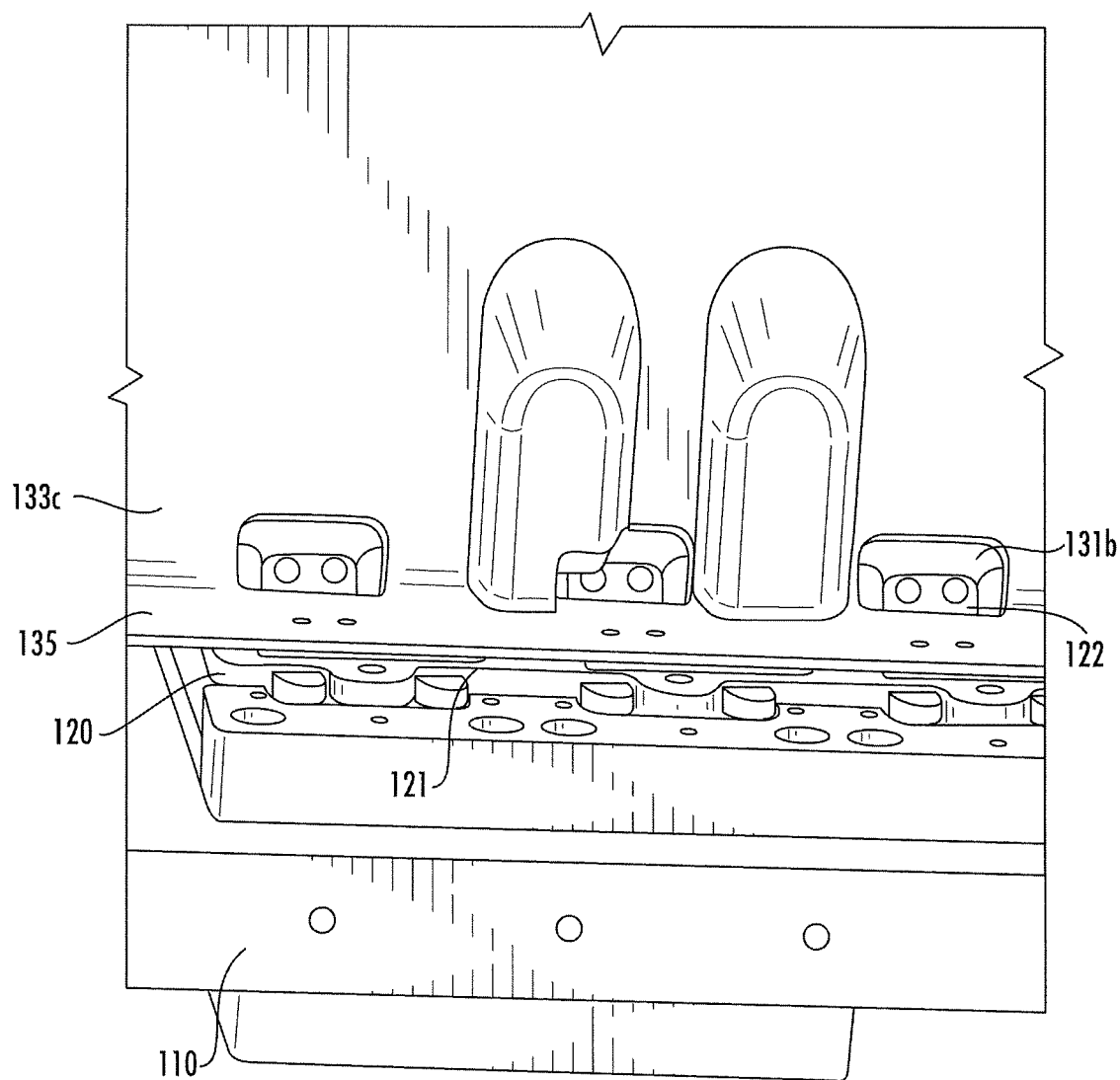
Figure 10:
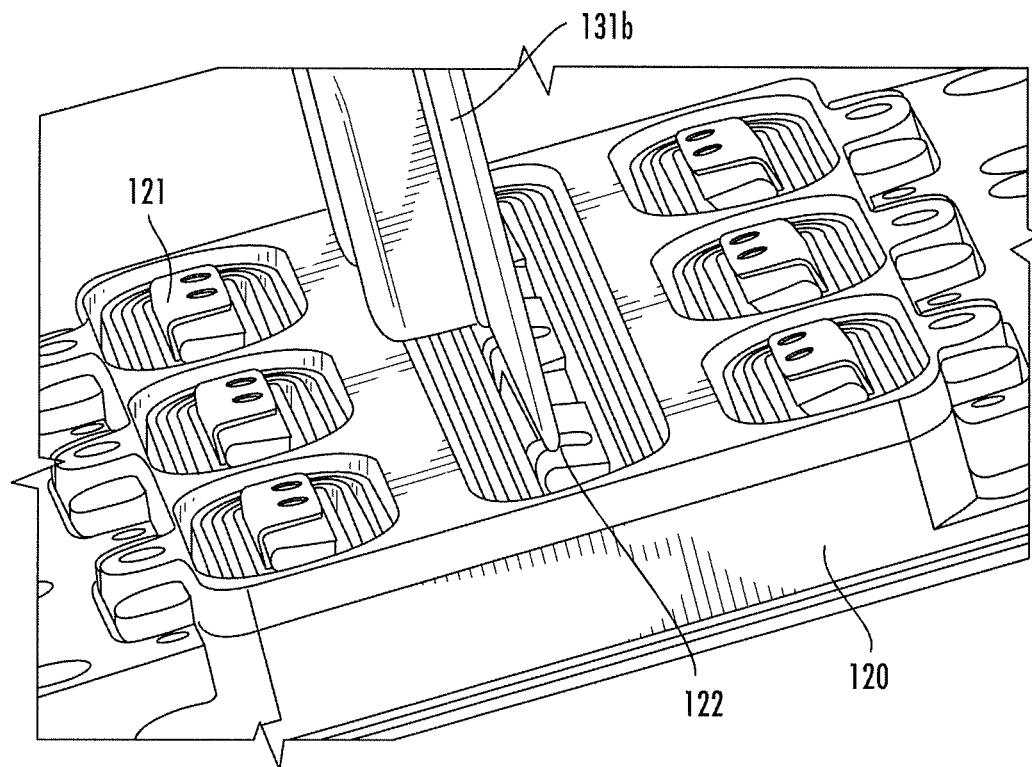
FIG. 10 is a cutaway view illustrating connection of a DC bus to a power transistor module in the power converter apparatus of FIGS. 1 and 2.

FIGS. 8-10 illustrate details of interconnections of the bus extension plates to the transistor modules 120. First contacts 121 of a transistor module 120 are contacted by a flange 135 at the end of the input/output bus extension plate 133c. Second contacts 122 of the transistor module 120 are connected to the extension plate 131b of the first DC bus 131. This contact arrangement can provided the connectivity illustrated in FIG. 17.

Figure 11:
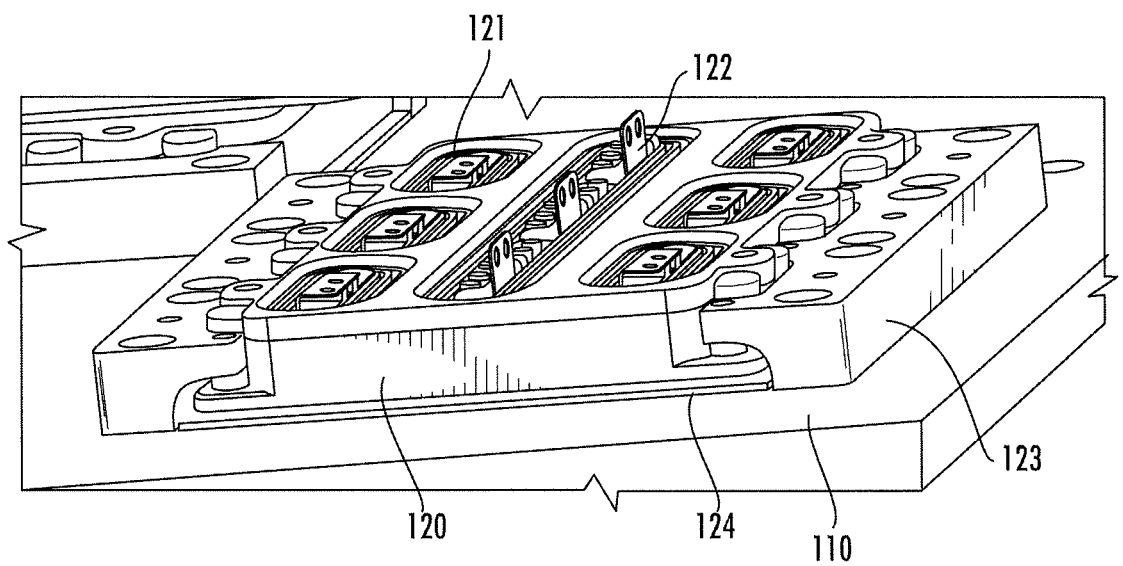
FIGS. 11-13 are perspective views of a power transistor module of the power converter apparatus of FIGS. 1 and 2.
Figure 12:
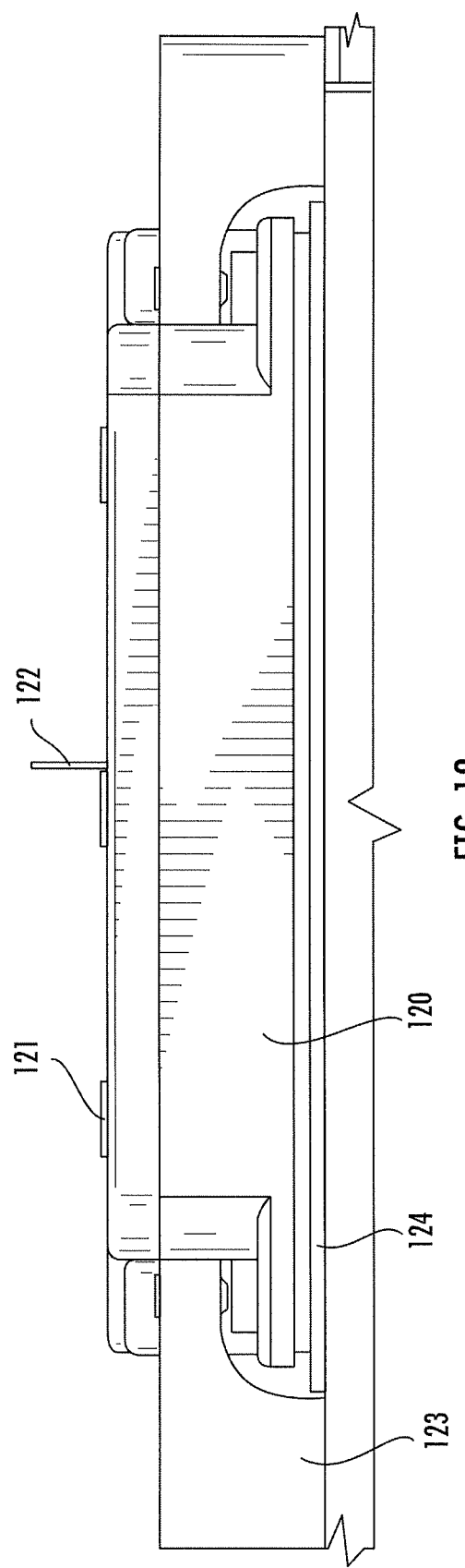
Figure 13:
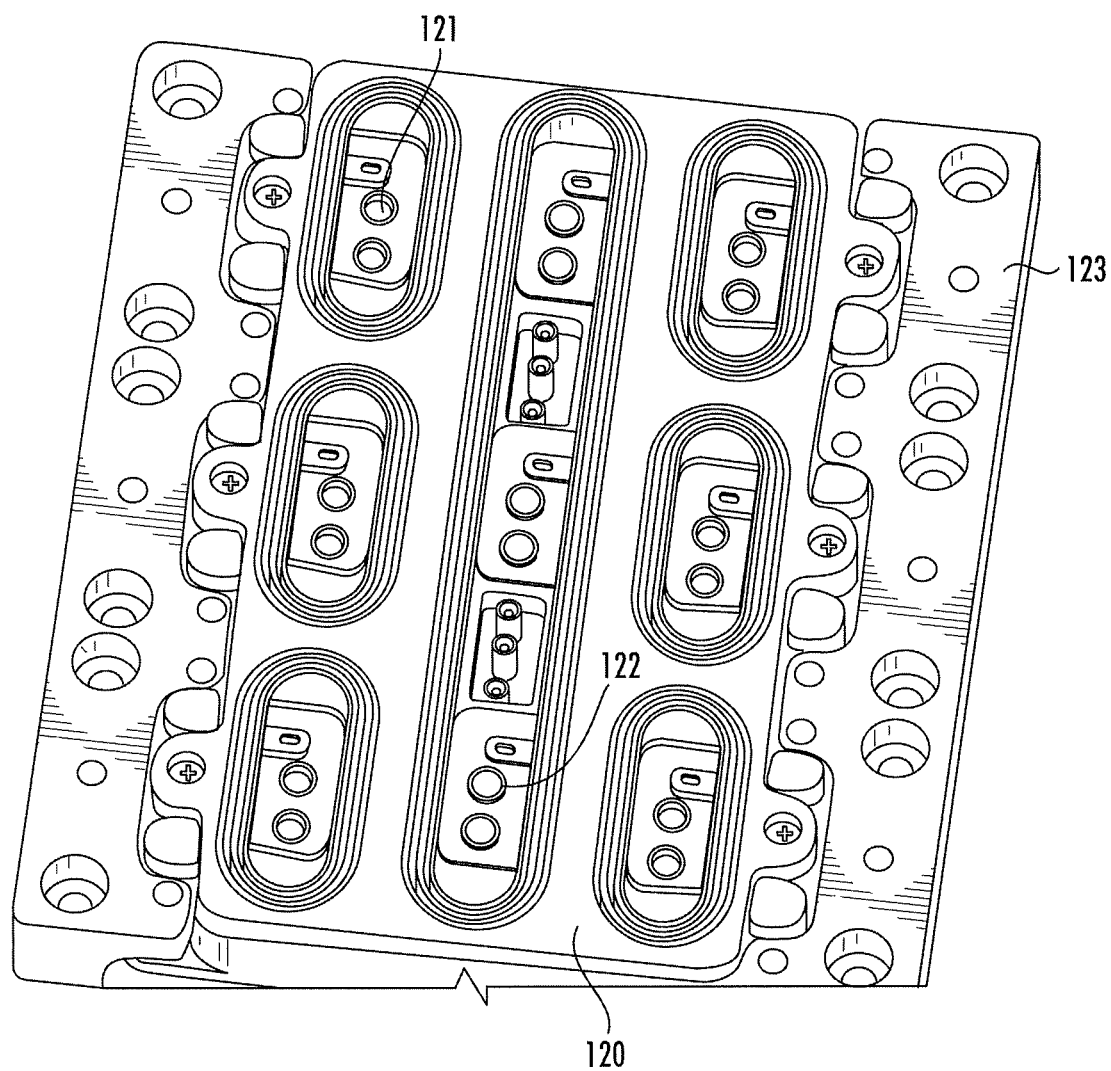

FIGS. 11-13 illustrate the mounting of the transistor module 120 on the heat sink 110. The base of the transistor module 120 is disposed on the heat sink 110, with a thermally conductive and electrically insulating ceramic pad 124 separating the transistor module 120 from the surface of the heat sink 110. Insulating ceramic clamps 123 on respective first and second sides of the transistor module 120 are used to secure the transistor module 120 to the heat sink 110 without an electrical connection between the transistor module 120 and the heatsink 110. This enables fabrication of the heatsink 110 from electrically conductive material (e.g., aluminum) and allows for grounding of the heatsink 110. The illustrated mounting arrangement using the insulating ceramic clamps 123 can also reduce the likelihood of arcing between the terminals 121, 122 of the transistor module 120 and adjacent metal structures in high voltage applications.

Figure 14:
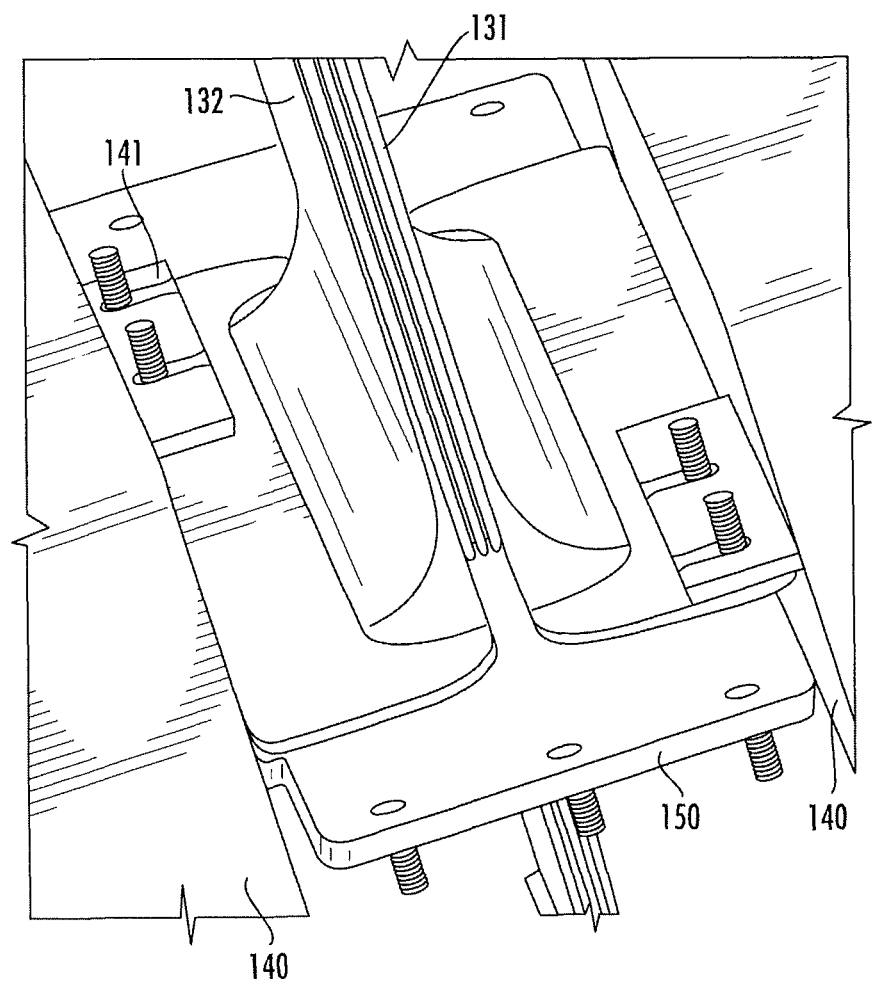
FIGS. 14-16 are perspective views of connection of a bus assembly to storage capacitors in the power converter apparatus of FIGS. 1 and 2.
Figure 15:
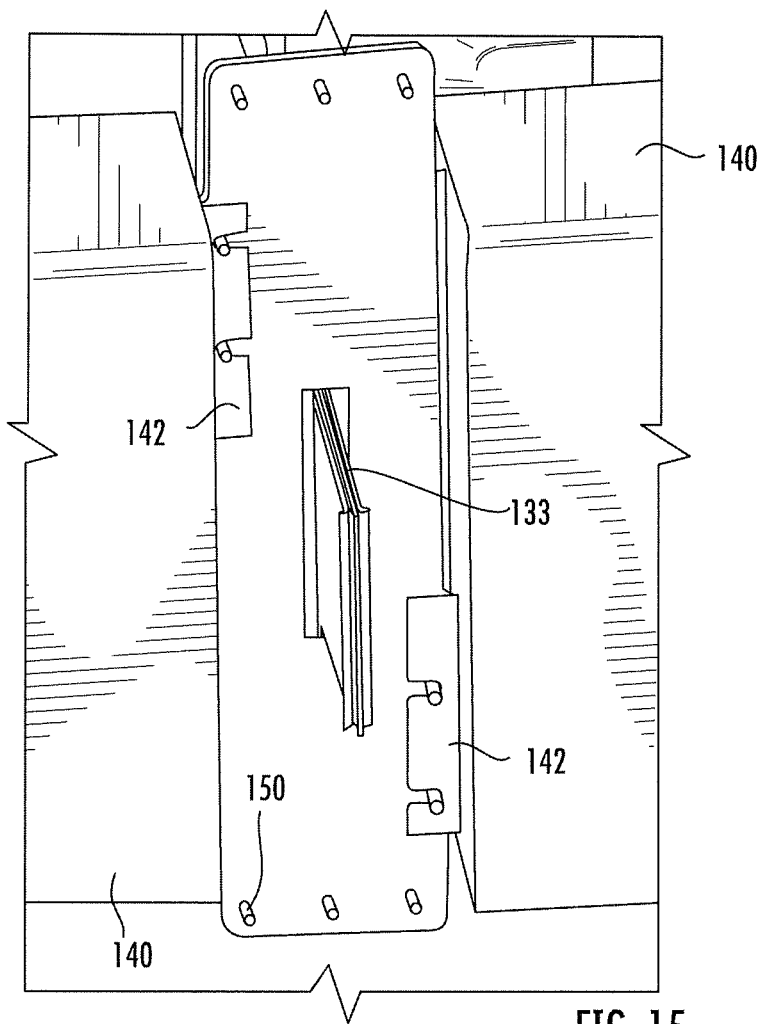
Figure 16:
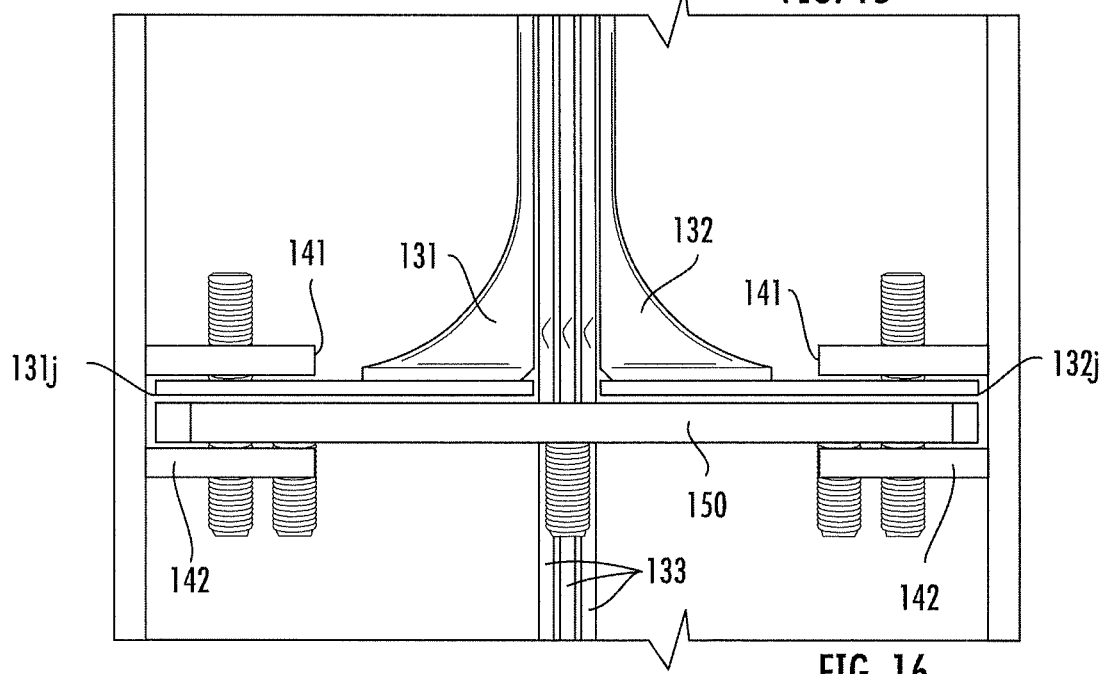

FIGS. 14-16 illustrate details of the connection of the DC buses 131, 132 to the capacitors 140 shown in FIGS. 1 and 2. As shown in FIG. 16, the DC buses 131, 132 have perpendicular bus extensions 131j, 132j that are configured to be attached to first terminals 141 of the capacitors 140. The common plate 150 is configured to be attached to second terminals of the capacitors 140. Bus extensions of the input-output buses 133 pass through an opening in the common plate, as can be seen in FIG. 15.

In the drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

That which is claimed:

1. An apparatus comprising:
   first, second and third core bus plates arranged in a parallel overlapped arrangement;

a first bus extension plate extending from the first core bus plate at a first angle with respect to the first core bus plate;

a second bus extension plate extending from the second core bus plate in a direction away from the first bus extension plate at a second angle with respect to the second core bus plate; and a third bus extension plate extending from the third core bus plate and disposed parallel to and overlapping the first bus extension plate;

a fourth bus extension plate extending from the third core bus plate and disposed parallel to and overlapping the second bus extension plate;

a first semiconductor switching device electrically connected to and positioned at ends of the first and third bus extension plates;

a second semiconductor switching device electrically connected to and positioned at ends of the second and fourth bus extension plates;

a first capacitor;

a second capacitor;

a fifth bus extension plate joined to the first bus core plate, extending at an angle therefrom and electrically connected to a first terminal of the first capacitor;

a sixth bus extension plate joined to the second bus core plate, extending at an angle therefrom and electrically connected to a first terminal of the second capacitor; and a common plate parallel to the fifth and sixth bus extension plates and electrically connected to second terminals of the first and second capacitors, wherein the third bus core plate has a portion extending between the fifth and sixth bus extension plates and through an opening in the common plate.

2. The apparatus of claim 1, wherein the third core bus plate is disposed between the first and second core bus plates.

3. The apparatus of claim 1:

wherein the first bus extension plate extends from the first core bus plate in a first direction perpendicular to a plane of the first core bus plate;

wherein the second bus extension plate extends from the second core bus plate in a second direction opposite the first bus direction;

wherein the third bus extension plate extends from the third core bus plate in the first direction; and wherein the fourth bus extension plate extends from the third core bus plate in the second direction.

4. The apparatus of claim 3, wherein the third and fourth bus extension plates lie in the same plane.

5. The apparatus of claim 3, wherein the first bus extension plate comprises a first planar member that joins the first core bus plate at a first arcuate joint, wherein the second bus extension plate comprises a second planar member that joins the second core bus plate at a second arcuate joint and wherein the third and fourth bus extension plates comprise third and fourth planar members that join the third core bus plate at a rounded Y joint.

6. The apparatus of claim 1, wherein the first bus extension plate joins the first core bus plate at a first edge thereof, wherein the second bus extension plate joins the second core bus plate at a first edge thereof, a wherein the fifth bus extension plate joins the first core bus plate at a second edge thereof and extends therefrom at a third angle, wherein the sixth bus extension plate joins the second core bus plate at a second edge thereof and extends therefrom at a fourth angle, and wherein the apparatus further comprises:

a fourth core bus plate disposed in parallel with the first, second and third core bus plates;

a seventh bus extension plate joined to the fourth core bus plate and disposed parallel to the fifth bus extension plate; and an eighth bus extension plate joined to the fourth core bus plate and disposed parallel to the sixth bus extension plate.

7. The apparatus of claim 6, wherein the first and fifth bus extension plates extend from the first core bus plate in a first direction perpendicular to a plane of the first core bus plate, wherein the second and sixth bus extension plates extend from the second core bus plate in a second direction opposite the first direction.

8. The apparatus of claim 7, further comprising:

a ninth bus extension plate joining the first core bus plate at a third edge thereof and extending therefrom at a fifth angle;

a tenth bus extension plate joining the second core bus plate at a third edge thereof and extending therefrom at a sixth angle;

a fifth core bus plate arranged in parallel with the first, second, third and fourth core bus plates;

an eleventh bus extension plate joined to the fifth core bus plate and disposed parallel to the ninth bus extension plate; and a twelfth bus extension plate joined to the fifth core bus plate and disposed parallel to the tenth bus extension plate.

9. The apparatus of claim 8, wherein the first, fifth and ninth bus extension plates extend from the first core bus plate in the first direction and wherein the second, sixth and tenth bus extension plates extend perpendicularly from the second core bus plate in the second direction.

10. The apparatus of claim 8, wherein the third, fourth and fifth core bus plates are disposed between the first and second core bus plates.

11. The apparatus of claim 6, wherein the third and fourth core bus plates are disposed between the first and second core bus plates.

* * * * *